(12) United States Patent
Nagai

(10) Patent No.: US 10,754,561 B2
(45) Date of Patent: Aug. 25, 2020

(54) INFORMATION PROCESSING APPARATUS AND STORAGE DEVICE

(71) Applicant: Toshiba Memory Corporation, Minato-ku (JP)

(72) Inventor: Koichi Nagai, Ota (JP)

(73) Assignee: Toshiba Memory Corporation, Minato-ku (JP)

( * ) Notice: Subject to any disclaimer, the term of this patent is extended or adjusted under 35 U.S.C. 154(b) by 52 days.

(21) Appl. No.: 16/031,646

(22) Filed: Jul. 10, 2018

(65) Prior Publication Data

US 2019/0265897 A1    Aug. 29, 2019

(30) Foreign Application Priority Data

Feb. 27, 2018   (JP) .................. 2018-033823

(51) Int. Cl.
| | |
|---|---|
| *G06F 3/06* | (2006.01) |
| *G11C 16/30* | (2006.01) |
| *G06F 1/3234* | (2019.01) |
| *G11C 5/14* | (2006.01) |

(Continued)

(52) U.S. Cl.
CPC .......... *G06F 3/0625* (2013.01); *G06F 1/3225* (2013.01); *G06F 1/3275* (2013.01); *G06F 3/0614* (2013.01); *G06F 3/0679* (2013.01); *G11C 5/14* (2013.01); *G11C 5/147* (2013.01); *G11C 7/1045* (2013.01); *G11C 16/30* (2013.01)

(58) Field of Classification Search
CPC .... G06F 3/0625; G06F 3/0614; G06F 3/0679; G06F 1/3225; G06F 1/3275; G11C 5/14; G11C 5/147; G11C 7/1045; G11C 16/30
See application file for complete search history.

(56) References Cited

U.S. PATENT DOCUMENTS

| 2012/0072755 A1* | 3/2012 | Jun ...................... G06F 1/3221 713/340 |
| 2013/0244455 A1* | 9/2013 | Imamaki ............... G06F 13/387 439/65 |
| 2016/0306768 A1* | 10/2016 | Mataya ............... G06F 13/4068 |

(Continued)

FOREIGN PATENT DOCUMENTS

| KR | 10-2013-0106262 A | 9/2013 |
| KR | 10-2017-0085773 A | 7/2017 |

OTHER PUBLICATIONS

"PCI Express M.2 Specification", Revision 1.1, Dec. 9, 2016, pp. 1-241.

*Primary Examiner* — Nimesh G Patel

(74) *Attorney, Agent, or Firm* — Oblon, McClelland, Maier & Neustadt, L.L.P.

(57) ABSTRACT

According to one embodiment, an information processing apparatus includes a connector to which a storage device is connectable. The apparatus includes a power supply circuit which supplies power to the storage device via one or more power pins of the connector. The first pin of the connector is set to a first electric potential or an open state based on a power supply capability of the power supply circuit. A state of the first pin which is set to the first electric potential indicates that a maximum power supplied from the power supply circuit to the storage device via the one or more power pins of the connector is a first power. A state of the first pin which is set to the open state indicates that the maximum power is a second power.

16 Claims, 12 Drawing Sheets

(51) Int. Cl.
*G11C 7/10* (2006.01)
*G06F 1/3225* (2019.01)

(56) References Cited

U.S. PATENT DOCUMENTS

2017/0109174 A1\* 4/2017 Desimone ............. G06F 9/4411
2017/0206974 A1\* 7/2017 Kong .................... G06F 3/0625

\* cited by examiner

| Pin | Signal | Signal | Pin |
|---|---|---|---|
| 74 | 3.3V | GND | 75 |
| 72 | 3.3V | GND | 73 |
| 70 | 3.3V | GND | 71 |
| ⋮ | ⋮ | ⋮ | ⋮ |
| | | GND | 51 |
| 50 | PERST#(I)(0/3.3V) | PERp0 | 49 |
| | | PERn0 | 47 |
| ⋮ | ⋮ | GND | 45 |
| | | PETp0 | 43 |
| | | PETn0 | 41 |
| | | GND | 39 |
| 38 | NC | PERp1 | 37 |
| 36 | NC | PERn1 | 35 |
| 34 | NC | GND | 33 |
| 32 | NC | PETp1 | 31 |
| 30 | NC | PETn1 | 29 |
| 28 | NC | GND | 27 |
| 26 | NC | PERp2 | 25 |
| 24 | NC | PERn2 | 23 |
| 22 | NC | GND | 21 |
| 20 | NC | PETp2 | 19 |
| 18 | 3.3V | PETn2 | 17 |
| 16 | 3.3V | GND | 15 |
| 14 | 3.3V | PERp3 | 13 |
| 12 | 3.3V | PERn3 | 11 |
| 10 | LED_1#(O) | GND | 9 |
| 8 | NC | PETp3 | 7 |
| 6 | NC | PETn3 | 5 |
| 4 | 3.3V | GND | 3 |
| 2 | 3.3V | GND | 1 |
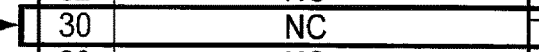
GND or Open (pointing to Pin 30)
F I G. 5

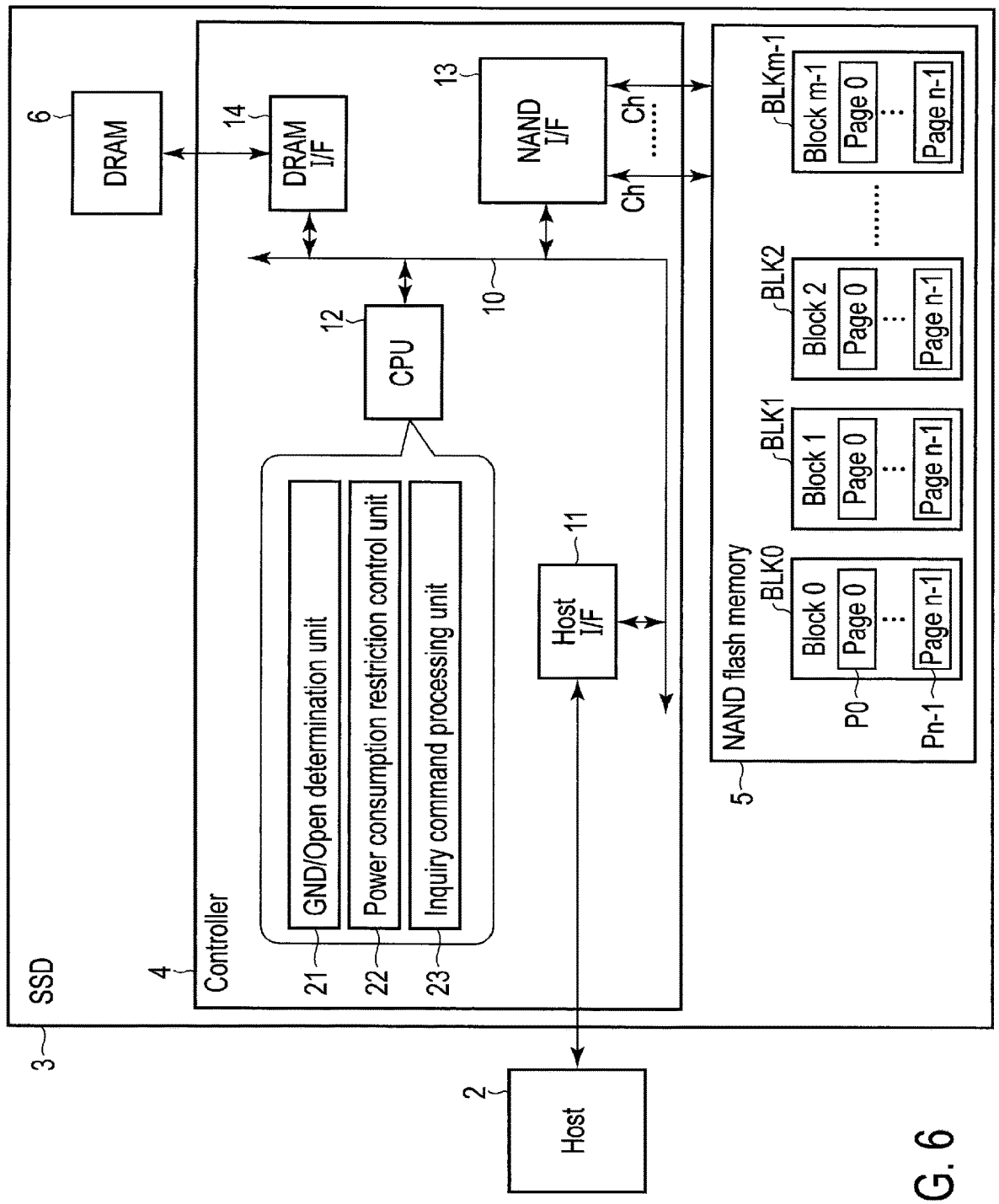
F I G. 6

| Power state number | Maximum power consumption | Pin 30 is GND | Pin 30 is Open |
|---|---|---|---|
| 0 | 14W | Available | Not available |
| 1 | 11W | Available | Not available |
| 2 | 8W | Available | Available |
| 3 | 5W | Available | Available |
F I G. 7
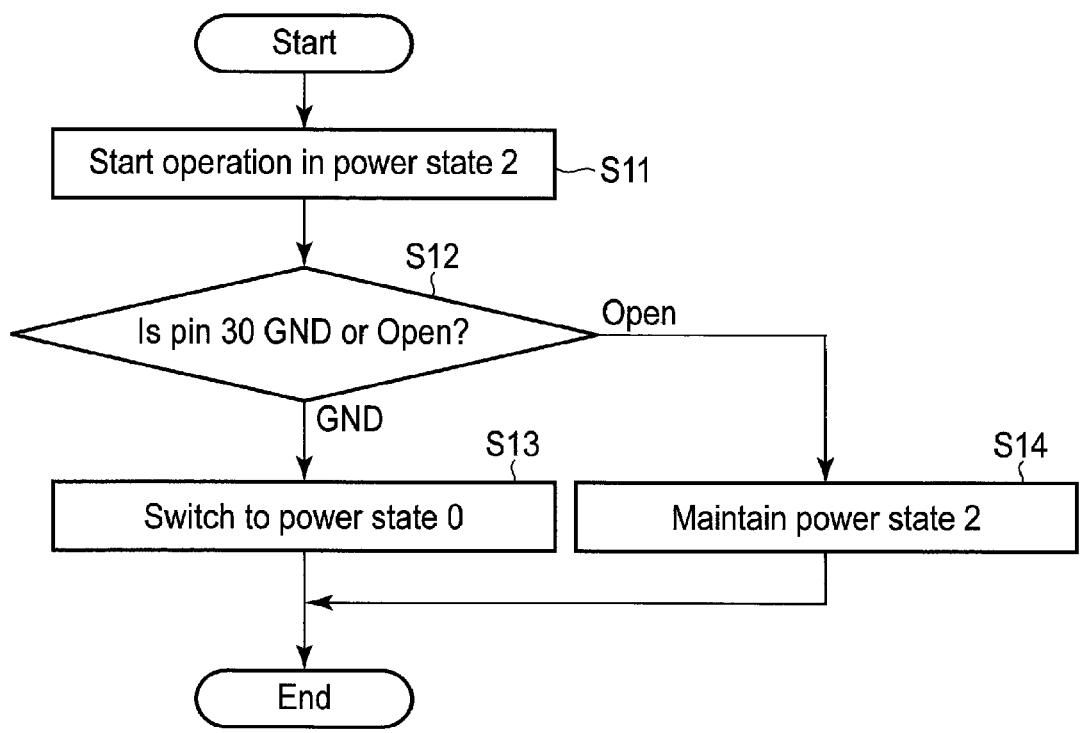
F I G. 8

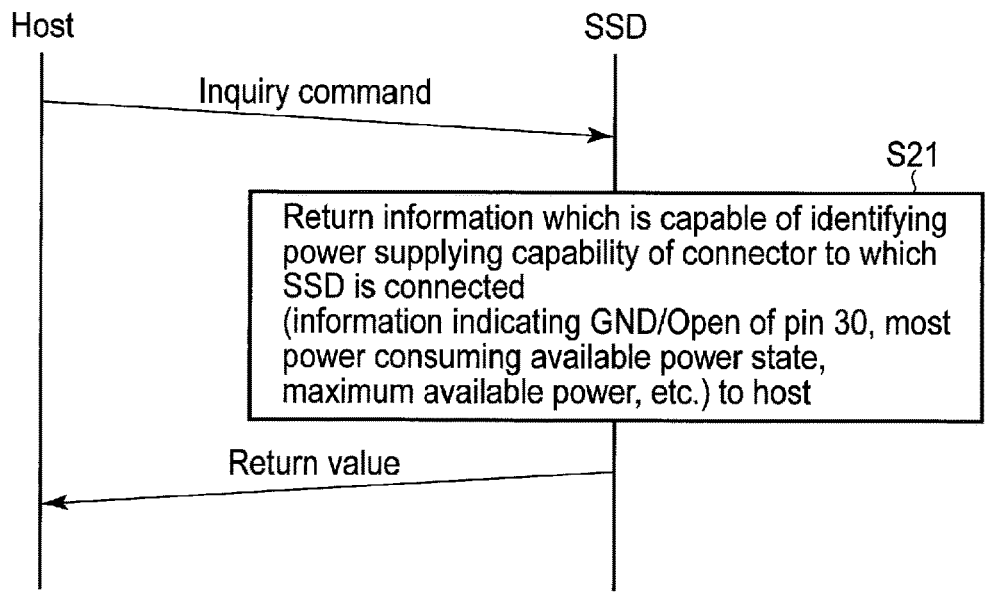
F I G. 9
Report maximum current of connector
| Bytes | O/M | Description | | | |
|---|---|---|---|---|---|
| 800 | O | Maximum supplied current of connector to which the SSD is attached | | | |
| | | Bits | Description | | |
| | | 7:2 | Reserved | | |
| | | 1:0 | | | |
| | | | Value | Description | |
| | | | 00b | Maximum current is not reported | |
| | | | 01b | 2.5A max | |
| | | | 10b | 4.5A max | |
| | | | 11b | Reserved | |
F I G. 10

| Bytes | O/M | Description | | |
|---|---|---|---|---|
| 800 | O | Maximum supplied current of connector to which the SSD is attached. | | |
| | | | Bits | Description |
| | | | 7:2 | Reserved |
| | | | 1 | If set to '1', then the maximum current supplied from a connector is 4.5A.<br><br>If cleared to '0', then the maximum current supplied from a connector is 2.5A. |
| | | | 0 | If set to '1', then this field is supported.<br>If cleared to '0', then this field is not supported. |

F I G. 11

Report maximum power of connector

| Bytes | O/M | Description | | | |
|---|---|---|---|---|---|
| 810 | O | Maximum supplied nominal power of connector to which the SSD is attached. | | | |
| | | | Bits | Description | |
| | | | 7:2 | Reserved | |
| | | | 1:0 | | |
| | | | | Value | Description |
| | | | | 00b | Maximum power is not reported |
| | | | | 01b | 8.25W max |
| | | | | 10b | 14.85W max |
| | | | | 11b | Reserved |

F I G. 12

Case of directly indicating suppliable power

| Bytes | O/M | Description |
|---|---|---|
| 821:820 | O | Maximum supplied nominal power of connector to which the SSD is attached:<br><br>This field indicates the maximum nominal power supplied from a connector to which the SSD is attached. The scale of this field is in 0.01 Watts.<br><br>A value of 0h indicates this power is not reported. |

F I G. 13

Report power state number

| Bytes | O/M | Description | |
|---|---|---|---|
| 830 | O | The lowest Number of Power State can be used with a connector to which the SSD is attached. | |
| | | Bits | Description |
| | | 7 | Reserved |
| | | 6:2 | The lowest Number of Power State can be used with a connector to which the SSD is attached. |
| | | 1 | If set to '1', then the SSD has no applicable power state and bits 6:2 shall be 000000b.<br>If cleared to '0', then the SSD has applicable power states. |
| | | 0 | If set to '1', then this field is supported.<br>If cleared to '0', then this field is not supported. |

F I G. 14

Report state of pin 30

| Bytes | O/M | Description |
|---|---|---|
| 840 | O | Pin30 of M.2 connector |

| Bits | Description |
|---|---|
| 7:2 | Reserved |
| 1 | If set to '1', then the pin 30 is open.<br>If cleared to '0', then the pin 30 is GND. |
| 0 | If set to '1', then this field is supported.<br>If cleared to '0', then this field is not supported. |

FIG. 15

Report state of connector

| Bytes | O/M | Description |
|---|---|---|
| 850 | O | Type of M.2 connector |

| Bits | Description |
|---|---|
| 7:2 | Reserved |
| 1 | If set to '1', then the SSD is connected to a high power M.2 connector.<br>If cleared to '0', then the SSD is connected to a normal power M.2 connector. |
| 0 | If set to '1', then this field is supported.<br>If cleared to '0', then this field is not supported. |

FIG. 16

| Power state number | Maximum power consumption | Pin 30 is GND | Pin 30 is Open |
|---|---|---|---|
| 0 | 14W | Available | Not available |
F I G. 17
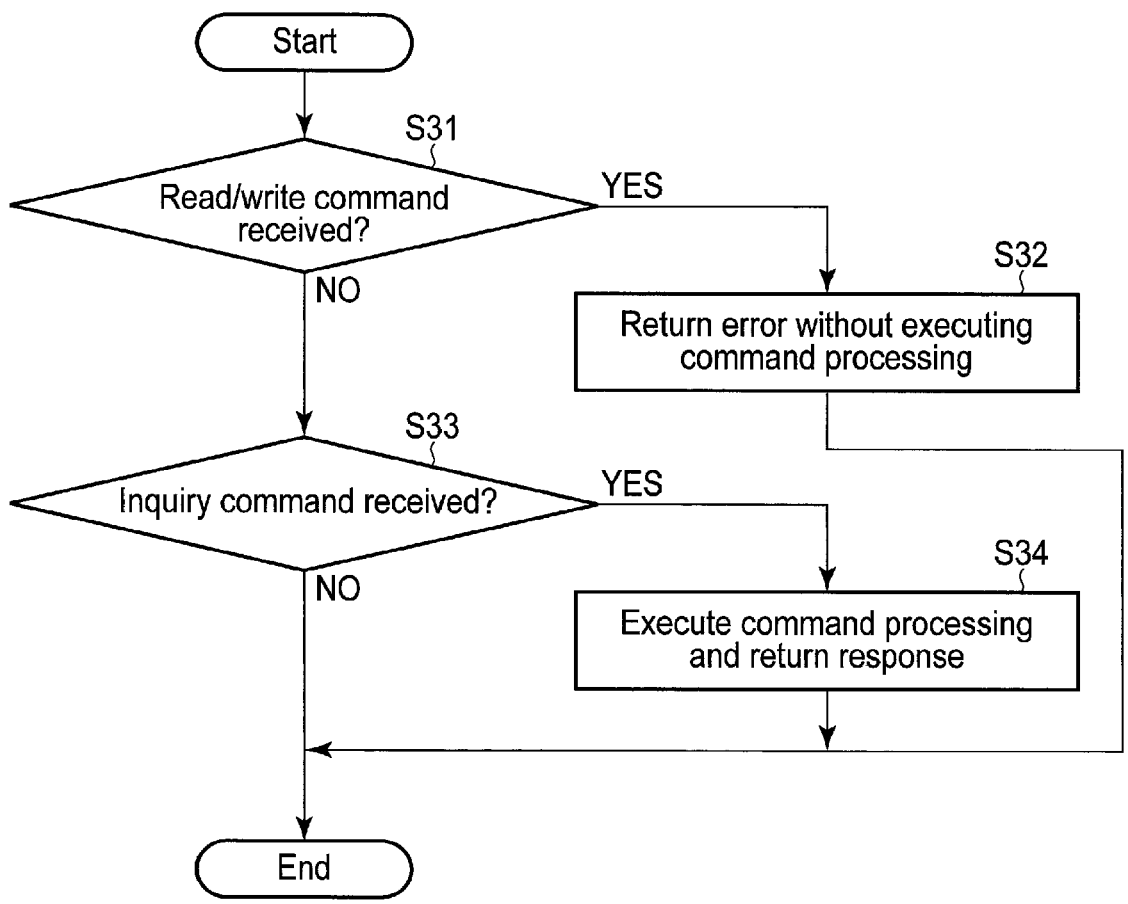
F I G. 18

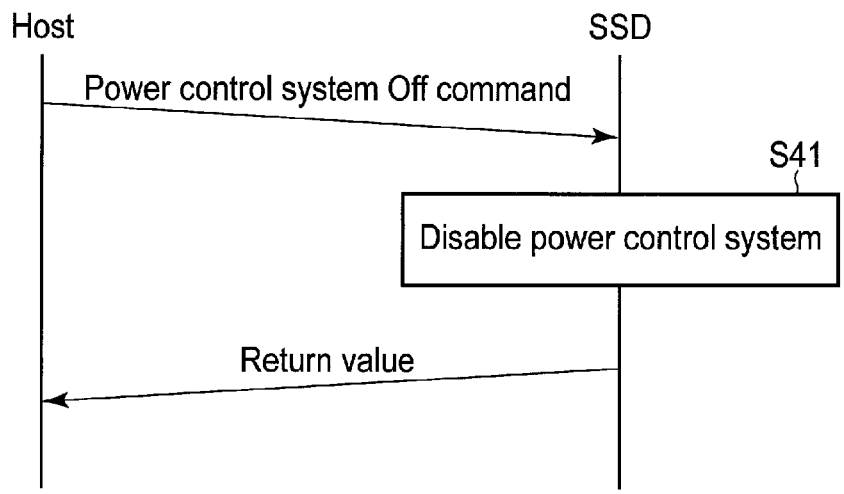
F I G. 19
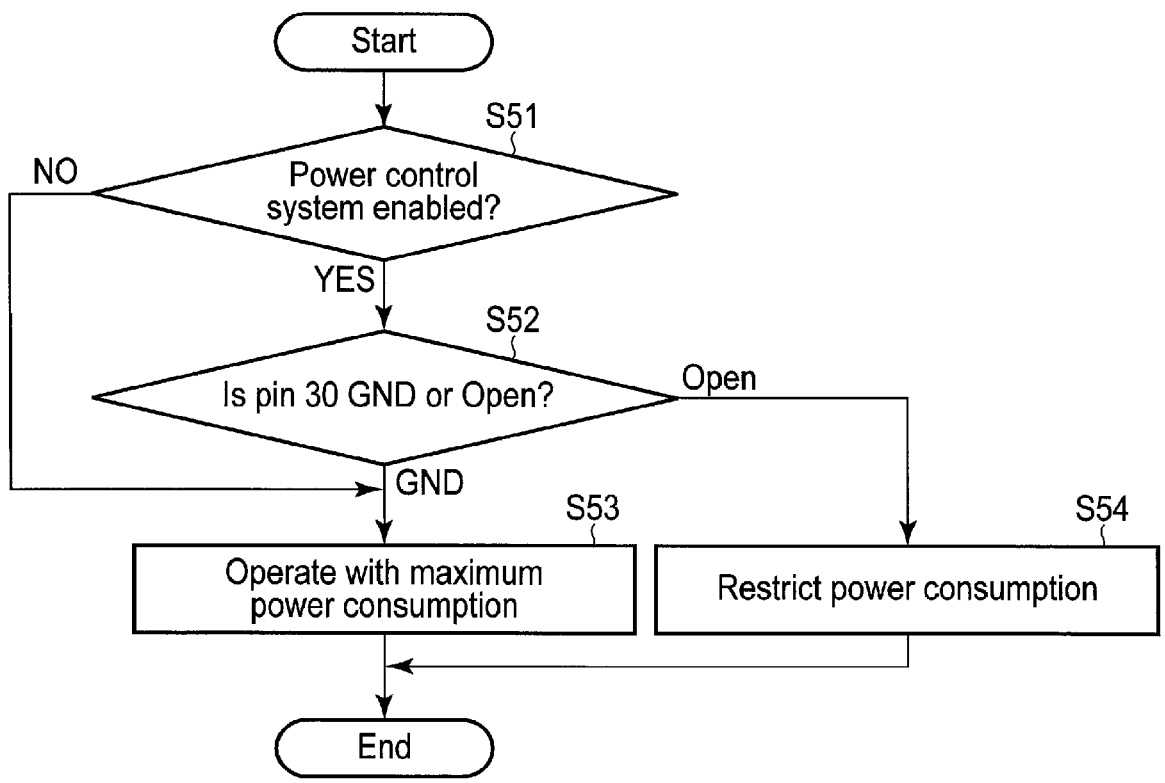
F I G. 20

INFORMATION PROCESSING APPARATUS AND STORAGE DEVICE

CROSS-REFERENCE TO RELATED APPLICATIONS

This application is based upon and claims the benefit of priority from Japanese Patent Application No. 2018-033823, filed Feb. 27, 2018, the entire contents of which are incorporated herein by reference.

FIELD

Embodiments described herein relate generally to a technique to control power consumption of a storage device.

BACKGROUND

In recent years, storage devices comprising nonvolatile memories have been widespread.

As one of these storage devices, solid state drives (SSDs) comprising NAND flash memories are known. Because of their low power consumption and high performance, SSDs are used as storages of various information processing apparatuses such as personal computers and server computers. These information processing apparatuses function as the hosts of SSDs.

In the hosts, SSDs are connected to connectors (also referred to as sockets) in the hosts and operate on power supplied from the hosts.

BRIEF DESCRIPTION OF THE DRAWINGS

FIG. 5 is a diagram showing an example of pin assignments of a connector (socket) in the information processing apparatus of the embodiment.

FIG. 6 is a block diagram showing a configuration example of the storage device of the embodiment.

FIG. 7 is a diagram showing a plurality of power states supported by the storage device of the embodiment.

FIG. 8 is a flowchart showing a procedure of a power consumption restriction process executed by the storage device of the embodiment in a case where the storage device of the embodiment has a plurality of power states.

FIG. 9 is a sequence diagram showing a procedure of processing executed by the storage device of the embodiment in response to an inquiry command.

FIG. 10 is a diagram showing an example of a data structure used for reporting a maximum current of the connector from the storage device of the embodiment to the host.

FIG. 11 is a diagram showing another example of the data structure used for reporting the maximum current of the connector from the storage device of the embodiment to the host.

FIG. 12 is a diagram showing an example of a data structure used for reporting a maximum power of the connector from the storage device of the embodiment to the host.

FIG. 13 is a diagram showing another example of the data structure used for reporting the maximum power of the connector from the storage device of the embodiment to the host.

FIG. 14 is a diagram showing an example of a data structure used for reporting the lowest power state number of power states which are available with the connector to which the storage device of the embodiment is connected, from the storage device of the embodiment to the host.

FIG. 15 is a diagram showing an example of a data structure used for reporting a state of a specific pin of the connector from the storage device of the embodiment to the host.

FIG. 16 is a diagram showing a data structure used for reporting the type of connector from the storage device of the embodiment to the host.

FIG. 17 is a diagram showing an example of a single power state supported by the storage device of the embodiment.

FIG. 18 is a flowchart showing a procedure of a power consumption restriction process executed by the storage device of the embodiment in a case where the storage device of the embodiment only has the single power stage.

FIG. 19 is a sequence diagram showing a procedure of processing executed by the storage device of the embodiment in response to a power control system Off command.

FIG. 20 is a flowchart showing a procedure of a power control process executed by the storage device of the embodiment.

DETAILED DESCRIPTION

Figure 1:
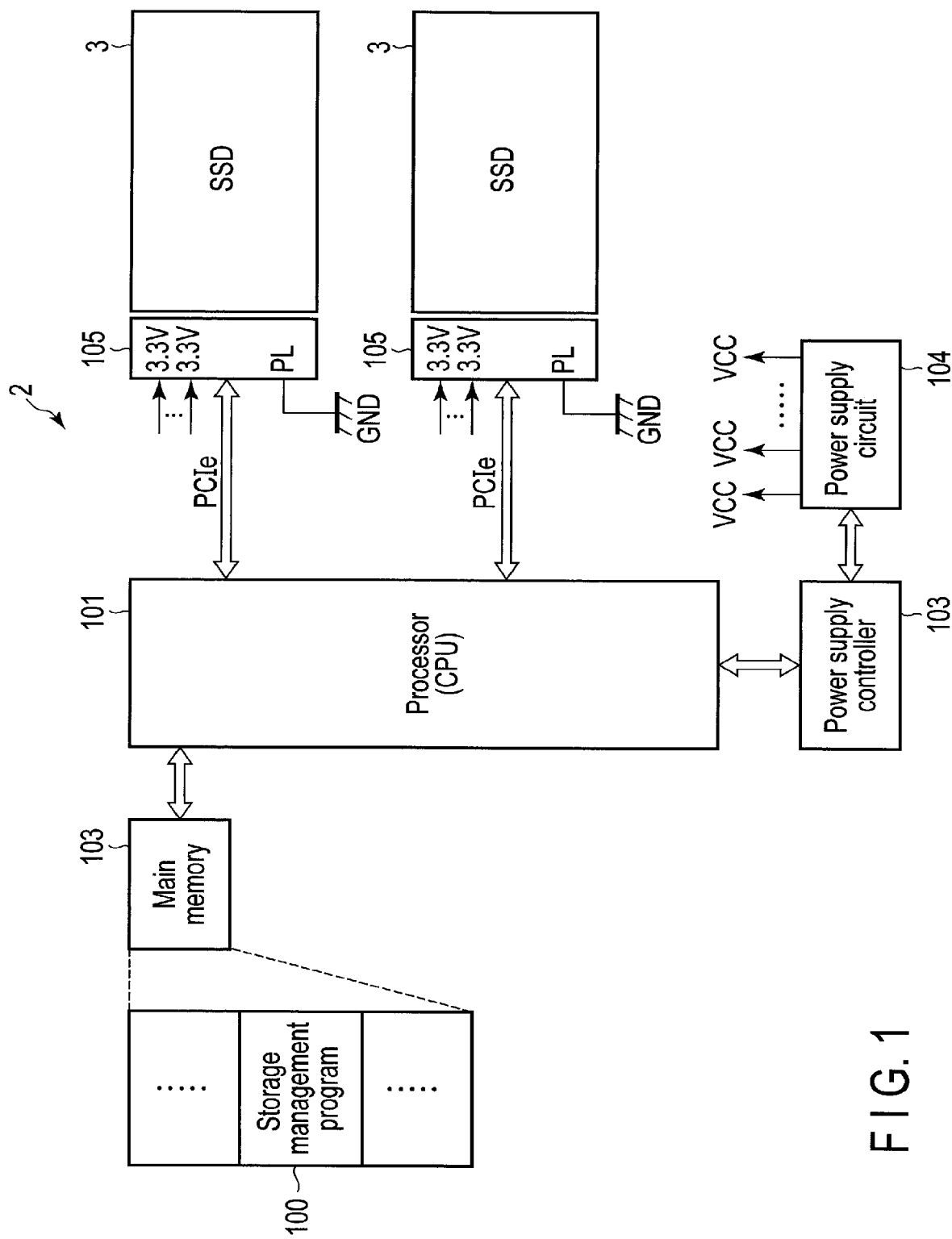
FIG. 1 is a block diagram showing a configuration example of an information processing apparatus (host) according to an embodiment.

Various embodiments will be described hereinafter with reference to the accompanying drawings.

In general, according to one embodiment, an information processing apparatus comprises a connector to which a storage device is connectable. The connector comprises a plurality of pins including one or more power pins and a plurality of signal pins. The information processing apparatus comprises a power supply circuit configured to supply power to the storage device via the one or more power pins. The plurality of pins of the connector include a first pin which is set to a first electric potential or an open state based on a power supply capability of the power supply circuit. A state of the first pin which is set to the first electric potential indicates that a maximum power supplied from the power supply circuit to the storage device via the one or more power pins of the connector is a first power. A state of the first pin which is set to the open state indicates that the maximum power supplied from the power supplied circuit to the storage device via the one or more power pins of the connector is a second power which is different from the first power.

Firstly, a configuration of a host (host system) 2 according to the embodiment will be described with reference to FIG. 1.

The host 2 is an information processing apparatus (referred to also as a computing device) such as a personal computer or a server computer and is configured to make a data write request, data read request, etc., to a solid state drive (SSD) 3 which is a storage device connected to the host 2.

The host 2 includes a processor (CPU) 101, a main memory 102, a power supply controller 103, a power supply circuit 104, a plurality of connectors 105, etc.

The processor 101 is a CPU configured to control the operations of components of this information processing apparatus. The processor 101 can execute various programs loaded from one of the SSDs 3 into the main memory 102. If RAID 1 (striping) is composed of a plurality of SSDs 3, these programs are loaded from these SSDs 3 constituting RAID 1 (striping). The main memory 102 is composed of a random access memory such as a DRAM.

The programs (host software) executed by the processor 101 include an application program, an operating system, a file system, a device driver, etc. Further, the host software may include a storage management program 100 which executes processing related to power management of each SSD 3.

Each SSD 3 supports at least one operation mode, and performs a data write operation and a data read operation on a nonvolatile semiconductor memory using a certain operation mode. In the SSD 3 which supports a plurality of operation modes, the amounts of power consumption in the operation modes are different from each other. Therefore, the operation modes are referred to also as power states.

Each SSD 3 may support up to a total of 32 operation modes (a total of 32 power states). In each SSD 3, power states may be identified by consecutive numbers from zero.

For example, if an SSD supports three operation modes, that is, a power state 0, a power state 1 and a power state 2, the power state 0 may indicate the most power consuming power state among the power state 0, the power state 1 and the power state 2. That is, the power that may be consumed in the power state 0 is largest.

The storage management program 100 obtains a data structure including information on power states from each SSD 3 and can recognize the power states supported by each SSD 3.

The data structure obtained from each SSD 3 may include a value which indicates a maximum power consumption corresponding to each power state and a value which indicates performance corresponding to each power state. The maximum power consumption corresponding to a certain power state indicates the maximum power which the SSD 3 is capable of consuming in this power state. The performance corresponding to a certain power state indicates the read/write performance in a case where a data read operation and a data write operation are performed on the nonvolatile semiconductor in this power state. The read/write performance may be represented, for example, by write throughput, write latency, read throughput, read latency, etc.

The power supply controller 103 functions as a system controller configured to execute power management of the host 2. The power supply controller 103 powers on and powers off the host 2 in accordance with the operations of a power switch by the user. The power supply circuit 104 supplies power to each component in the host 2 and also supplies power to the SSD 3 connected to each connector 105.

Each connector 105 is configured to be connected to the SSD 3. Each connector 105 is also referred to as a socket. Each connector 105 has a plurality of pins. These pins include one or more power pins, a plurality of signal pins for a serial interface, etc. The power supply circuit 104 supplies power to the SSD 3 via one or more power pins of the connector 105. The signal pins for the serial interface may support a plurality of lanes, for example, four lanes of serial interface. Each lane includes a differential signal line pair for transmission and a differential signal line pair for reception.

The connector 105 may be a connector for a serial interface such as PCI Express (registered trademark) (PCIe) standards. In the following, the connector 105 is assumed to be realized as a connector (M.2 connector) conforming to the PCI Express M.2 Specification.

If the connector 105 is an M.2 connector, the SSD 3 is realized as a PCI Express M.2 device attachable to this connector 105. The PCI Express M.2 device is an add-in card device having smaller form factors in both size and volume. In the connector 105 realized as the M.2 connector, nine power pins (nine 3.3 V pins) are defined in addition to a plurality of signal pins for a serial interface.

The signal pins for the serial interface are used for transferring a plurality of differential signal pairs between the host 2 and the SSD 3. In the host 2, the signal pins may be connected to, for example, PCI Express port of the processor 101 via PCI Express bus. Alternatively, the signal pins for the serial interface may be connected to the PCI Express port of the processor 101 via a PCI Express bus switch.

In the PCI Express M.2 Specification, the maximum current which can be supplied to the SSD 3 via the connector 105 is 2.5 A.

Since the maximum current per one 3.3 V pin is 0.5 A (8.25 W at 3.3 V, and 7.8375 W at the worst as the actual power supply voltage ranges from 3.135 to 3.465 V), in practice, a maximum current of 2.5 A (a maximum power of 8.25 W) can be realized by five 3.3 V pins. In the connector 105, four 3.3 V pins are added and a total of nine power pins are provided as described above. The extra four 3.3 V pins (extra power pins) are not intended for increasing the maximum power (or maximum current) which can be supplied to the SSD 3 but are used for reducing the voltage drop of the power supply voltage (3.3 V).

However, in recent years, a high-performance SSD using this connector for a high-performance information processing apparatus such as a server computer has been connector) which can supply a maximum current of 4.5 A (a maximum power of 14.85 W at a voltage of 3.3 V and a maximum power of 14.1075 W at a voltage of 3.135 V) by supplying 0.5 A to each of the extra four 3.3 V pins, and a high-performance SSD which requires a maximum power consumption of 4.5 A (a maximum power of 14.85 W at a voltage of 3.3 V and a maximum power of 14.1075 W at a voltage of 3.135 V) have been in demand.

However, if the high-performance SSD which requires such high power consumption is mistakenly inserted into a conventional connector of the host which only supplies a current of 2.5 A, a large current which the host does not expect will flow.

As a result, a trouble such as operation of an over-current protection circuit or burnout of a fuse for over-current protection may occur in the host. Alternatively, as power is oversupplied, the power supply voltage decreases, and the signal level decreases, accordingly. As a result, for example, an active low reset signal may be asserted. In this case, a system circuit may be unexpectedly reset, and a malfunction may be caused in the host or the SSD.

Further, in such occasions, since the user unintentionally connects an SSD which requires high power consumption to a connector which does not have the capability of supplying sufficient power, it may take a lot of time for the user to determine the cause of the malfunction.

Therefore, in the present embodiment, as the SSD 3 checks that a specific pin of pines which are conventionally NC pins (Not Connected: pins which are not electrically connected to anywhere, that is, pins in an open state) of the connector 105 is connected to a ground (GND) on the host 2 side, the SSD 3 can which can supply a maximum current of 4.5 A (a maximum power of 14.85 W at a voltage of 3.3 V). This specific pin is hereinafter referred to as a PL (power level).

In other words, in the host 2, a plurality of pins of the connector 105 includes a first pin (that is, a pin (PL) which is set to a first electric potential (for example, the ground (GND) potential) or the open state in accordance with the power supplying capability of the power supply circuit 104.

The state of the pin (PL) set to the first electric potential indicates that the maximum power supplied from the power supply circuit 104 to the SSD 3 via the power pins (here, nine 3.3 V pins) of the connector 105 is a first power.

The state of the pin (PL) set to the open state indicates that the maximum power supplied from the power supply circuit 104 to the SSD 3 via the power pins (here, nine 3.3 V pins) is a second power different from the first power.

Here, regarding the relationship between the first power and the second power, the first power may be greater than the second power (the first power>the second power). In this case, the first power is 14.85 W (=4.5 A), and the second power is 8.25 W (=2.5 A). That is, the maximum current corresponding to the first power is a first maximum current (here, 4.5 A) which is obtained by multiplying a first current supplied per 3.3 V pin (here, 0.5 A) by the total number of the 3.3 V pins (here, 9), and the maximum current corresponding to the second power is a second maximum current (here, 2.5 A) lower than the first maximum current.

If the maximum power which can be supplied from the power supply circuit 104 to the SSD 3 via the connector 5 is the first power, in the host 2, the pin (PL) is connected to the GND. FIG. 1 is based on the assumption that the power supply circuit 104 has the capability of supplying the first power to each of two SSDs 3 via two connectors 105, that is, the maximum power of each of two connectors 105 is 14.85 W (=4.5 A). In this case, the above-described pin (PL) is connected to the GND in each of the two connectors 105.

If the maximum power of one connector 105 is 14.85 W (=4.5 A) and the maximum power of the other connector 105 is 8.25 W (=2.5 A), only the pin (PL) of one connector 105 is connected to the GND and the pin (PL) of the other connector 105 is not connected to anywhere, that is, the pin (PL) of the other connector 105 is set to the open state.

In FIG. 1, if the maximum power of the connector 105 is 14.85 W (−4.5 A), the pin (PL) of the connector 105 is directly connected to the GND, but this pin (PL) may be connected to the GND via a switch circuit which is turned on/off by a control signal.

An example of the switch circuit is an open drain circuit composed of a MOSFET. In this case, the pin (PL) is connected to the GND via the open drain circuit on the host 2 side. As the open drain circuit is turned on/off, the pin (PL) is connected to the GND in a high impedance state (MOSFET=off) or a low impedance state (MOSFET=on). On the SSD 3 side, as the pin (PL) is pulled up, a voltage at a low level or high level in accordance with the state of the pin (PL) (whether the pin (PL) is connected to the GND in the low impedance state or is connected to the GND in the high impedance state) can be detected.

Further, the SSD 3 may be provided in a carrier which can be inserted into the information processing apparatus which functions as the host 2.

Figure 2:
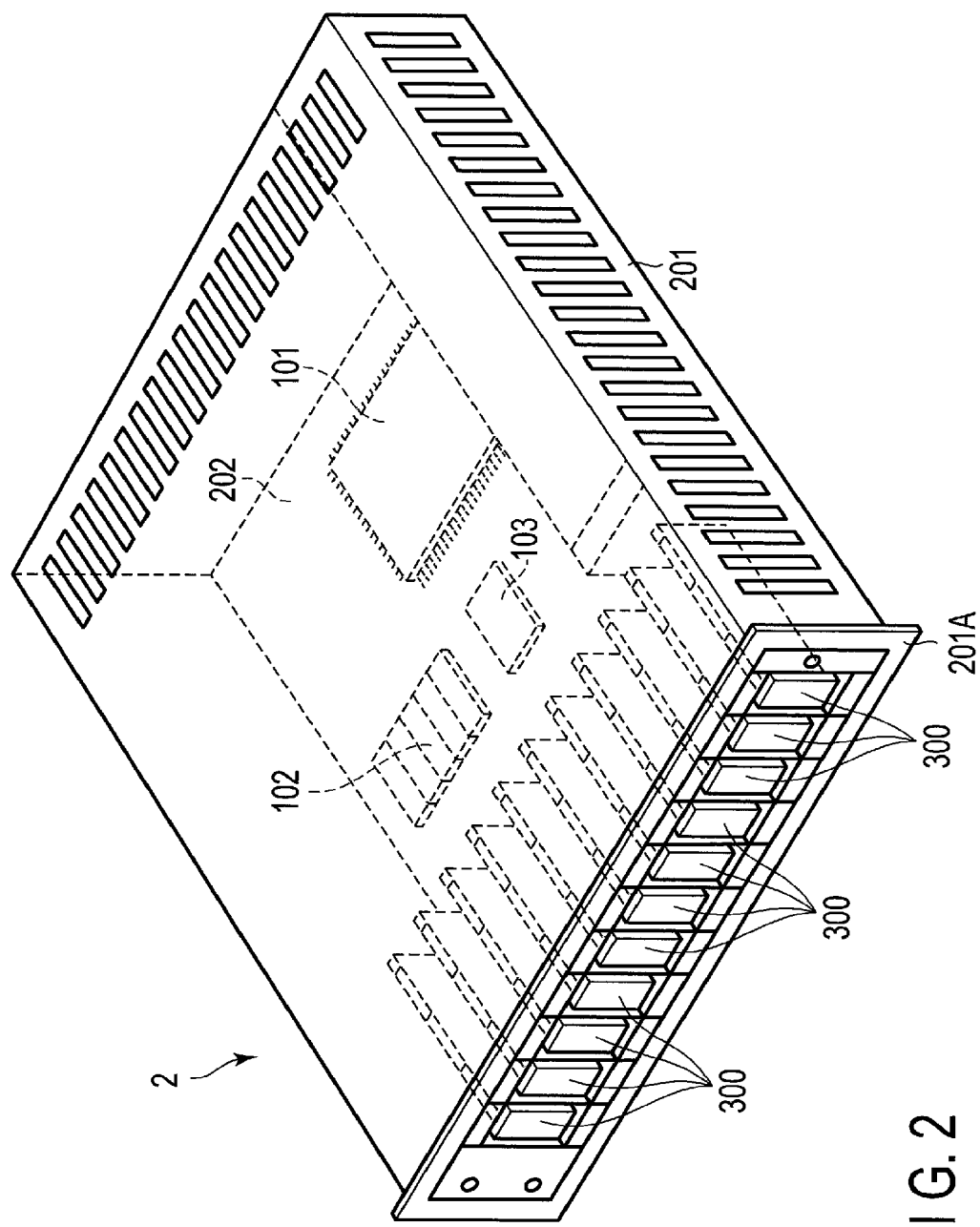
FIG. 2 is a perspective view showing a structure example of a housing of the information processing apparatus of the embodiment which comprises a plurality of carriers.

FIG. 2 shows an example of the structure of the housing of the host (information processing apparatus) 2 including a plurality of carriers.

The host (information processing apparatus) 2 includes a thin box-shaped housing 201 which can be accommodated in a rack. A plurality of carriers 300 are accommodated on a front surface 201A side of the housing 201, for example. Each carrier 300 can be detached from the housing 201 when needed. Each carrier 300 can carry one or more SSDs. A system board (motherboard) 202 is provided in the housing 201. Various electronic components including the CPU 101, the memory 102, the power supply controller 103, etc., are mounted on the system board (motherboard) 202.

Figure 3:
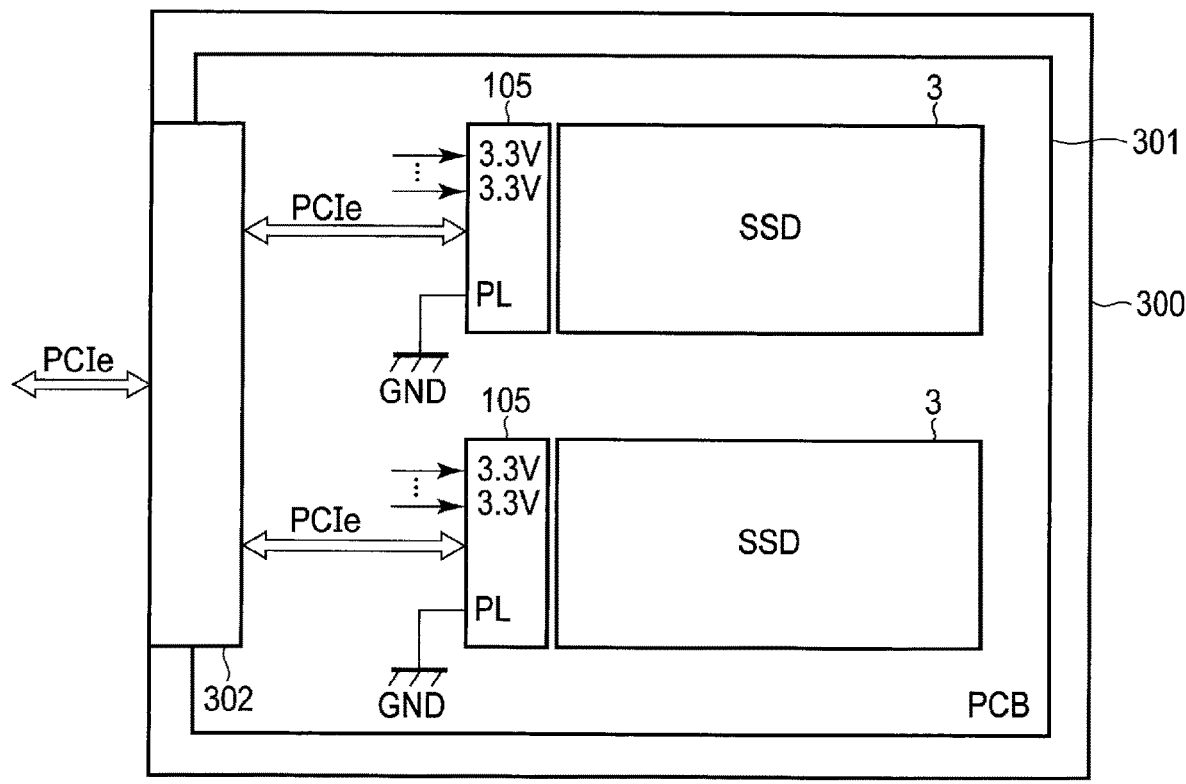
FIG. 3 is a block diagram showing a configuration example of the carrier.

FIG. 3 shows a configuration example of the carrier 300.
FIG. 3 shows an exemplary configuration of the carrier 300 which is equipped with two SSDs 3. The carrier 300 includes a printed circuit board (PCB) 301. Two connectors 105 to which the SSDs 3 are attached, respectively, are provided on the printed circuit board (PCB) 301. The two connectors 105 are realized as the above-described M.2 connectors.

The two connectors 105 may be connected to a PCI Express bus on the system board (motherboard) 202 via another connector 302 provided on the printed circuit board (PCB) 301. Alternatively, a PCI Express bus switch may be provided between the two connectors 105 and the connector 302.

Figure 4:
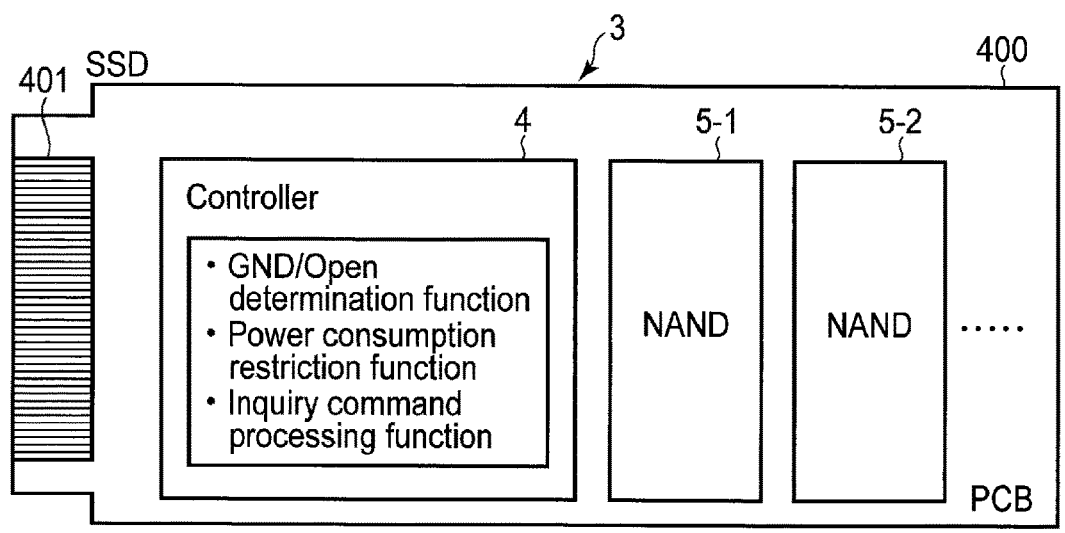
FIG. 4 is a diagram showing a structure example of a storage device of the embodiment.

FIG. 4 shows a structure example of the SSD 3.
The SSD 3 may be realized as the above-described high-performance SSD which requires high power consumption. In a case where the SSD 3 is realized as a PCI Express M.2 device, the SSD 3 includes a printed circuit board (PCB) 400. A controller 4 and one or more NAND flash memory chips 5-1, 5-2, . . . which are nonvolatile semiconductor memories are provided on the printed circuit board (PCB) 400. Further, one edge of the printed circuit board (PCB) 400 includes a card edge connector 401. The card edge connector 401 includes a plurality of pins arranged in the same manner as those of the connector 105. As one edge of the printed circuit board (PCB) 400 is inserted into the connector 105, the SSD 3 is attached to the connector 105.

The controller 4 is configured to control the NAND flash memory chips 5-1, 5-2, . . . .

The controller 4 is configured to perform a GND/Open determination function, a power consumption restriction function, and an inquiry command processing function. The GND/Open determination function is the function of determining the power supplying capability of the connector 105 depending on whether a specific pin (PL) of the connector 105 to which the SSD 3 is attached is set to the first electric potential (GND) or the open state. The open state includes a state where the pin (PL) is not connected to anywhere and a state where the pin (PL) is connected to the GND in the high impedance state.

The power consumption restriction function is the function of restricting the maximum power consumption of the SSD 3 to the first power or less if the pin (PL) is set to the first potential (GND) and of restricting the maximum power consumption of the SSD 3 to the second power different from the first power or less if the pin (PL) is set to the open state.

The inquiry command processing function is the function of notifying the host 2 of information which is capable of identifying the power supplying capability of the connector 105 to which the SSD 3 is attached in response to an inquiry command from the host 2. Here, the inquiry command is one of commands by which the host 2 requests the SSD 3 to report the state of the SSD 3 or various setting information of the SSD 3.

The information capable of identifying the power supplying capability of the connector 105 is not limited to any particular information but may include the following.

(1) Information which indicates whether the pin (PL) of the connector 105 to which the SSD 3 is attached is set to the first potential (GND) or the open state.

(2) Information which indicates whether the maximum power (or maximum current) which is available with the connector 105 to which the SSD 3 is attached (that is, the maximum power (or the maximum current) which is capable of supplying from this connector) is 14.85 W (=4.5 A) or 8.25 W (=2.5 A).

(3) Information which indicates the most power consuming operation mode which is available with the connector 105 to which the SSD 3 is attached.

(4) Information which indicates whether the connector 105 to which the SSD 3 is attached is a high-power M.2 connector or a normal-power M.2 connector.

The high-power M.2 connector means an M.2 connector which can supply the first power (14.85 W). The normal-power M.2 connector means an M.2 connector which can supply up to the second power (8.25 W).

Another example of the structure of the SSD 3 is a BGA SSD in which NAND flash memories and a controller are accommodated in a single package.

FIG. 5 shows an example of pin assignments of the connector 105.

In FIG. 5, "PERp0" and "PERn0" indicate a differential signal pair for reception of a lane 0, and "PETp0" and "PETn0" indicate a differential signal pair for transmission of the lane 0. "PERp1" and "PERn1" indicate a differential signal pair for reception of a lane 1, and "PETp1" and "PETn1" indicate a differential signal pair for transmission of the lane 1. "PERp2" and "PERn2" indicate a differential signal pair for reception of a lane 2, and "PETp2" and "PETn2" indicate a differential signal pair for transmission of the lane 2. "PERp3" and "PERn3" indicate a differential signal pair for reception of a lane 3, and "PETp3 and PETn3" indicate a differential signal pair for transmission of the lane 3.

"3.3 V" indicates a power pin, and "GND" indicates a GND pin. "PERST #" indicates an active low reset signal. This reset signal is used for resetting a circuit in the SSD 3. "NC" indicates a not connected pin. In the present embodiment, one of not connected pins (for example, a pin 30) is used as the above-described specific pin (PL).

FIG. 6 shows an example of the configuration of the SSD 3.

The SSD 3 includes the controller 4 and a nonvolatile semiconductor memory (NAND flash memory) 5. The NAND flash memory 5 may include a plurality of NAND flash memory chips. The controller 4 operates as a memory controller which is electrically connected to the NAND flash memory 5, controls the NAND flash memory 5, and performs a data write operation and a data read operation on the NAND flash memory 5. The controller 4 may be realized as a circuit such as a system-on-a-chip (SoC).

The SSD 3 may include a random access memory, for example, a DRAM 6.

The NAND flash memory 5 includes a memory cell array including a plurality of memory cells arranged in a matrix. The NAND flash memory 5 may be a NAND flash memory of a two-dimensional structure or may be a flash memory of a three-dimensional structure.

The memory cell array of the NAND flash memory 5 includes a plurality of blocks BLK0 to BLKm-1. Each of the blocks BLK0 to BLKm-1 includes a plurality of pages (here, pages P0 to Pn-1). The blocks BLK0 to BLKm-1 function as erase units. Each of the pages P0 to Pn-1 includes a plurality of memory cells connected to the same word line. The pages P0 to Pn-1 are the units of data write operation and data read operation.

The controller 4 includes a host interface 11, a CPU 12, a NAND interface 13, a DRAM interface 14, etc. The CPU 12, the NAND interface 13 and the DRAM interface 14 are interconnected via a bus 10.

The host interface 11 receives various commands (for example, a write command, a read command, commands (inquiry commands) which request to report the state or various settings of the SSD 3, etc.) from the host 2.

The CPU 12 is a processor configured to control the host interface 11, the NAND interface 13 and the DRAM interface 14. The CPU 12 loads a control program (firmware) stored in the NAND flash memory 5 or a ROM which is not shown in the drawing into the DRAM 6, and executes this firmware to execute various processes. The operation of the CPU 12 is controlled by the above-described firmware executed by the CPU 12.

By executing the above-described firmware, the CPU 12 can function as a GND/Open determination unit 21, a power consumption restriction control unit 22 and an inquiry command processing unit 23. The GND/Open determination unit 21, the power consumption restriction control unit 22 and the inquiry command processing unit 23 may be partially or entirely realized by hardware in the controller 4.

The GND/Open determination unit 21 determines in cooperation with the host interface 11 whether the pin (PL) (for example, the pin 30) in the connector 105 to which the SSD 3 is attached is set to the first electric potential GND or the open state.

The power consumption restriction unit 22 restricts the maximum power consumption of the SSD 3 to the first power or less when the pin (PL) is set to the first potential (GND) and restricts the maximum power consumption of the SSD 3 to the second power different from the first power or less when the pin (PL) is set to the open state.

For example, the controller 4 has a plurality of operation modes (i.e., a plurality of power states) which consumes different amounts of power, and in a case where the controller 4 is configured to perform a data write operation and a data read operation on the NAND flash memory 5 in any one of the power states, the power consumption restriction control unit 22 may change the operation mode used by the controller 4 depending on whether the pin (PN) (for example, the pin 30) is set to the first potential (GND) or the open state.

In this case, if the pin (PL) is set to the first electric potential (GND), the controller 4 may perform a data write operation and a data read operation on the NAND flash memory 5 using a first operation mode among the operation modes. In the first operation mode, a maximum power consumption thereof is the first power or less. That is, a maximum power which the SSD 3 is capable of consuming in the first operation mode is the first power or less. On the other hand, if the pin (PL) is set to the open state, the controller 4 may perform a data write operation and a data read operation on the NAND flash memory 5 using a second operation mode among the operation modes. In the second operation mode, a maximum power consumption thereof is the second power or less. That is, a maximum power which the SSD 3 is capable of consuming in the second operation mode is the second power or less.

The second operation mode may be an operation mode in which the number of NAND flash memory chips accessed in parallel is less than that of the first operation mode.

In a case where the controller 4 is configured to support only one operation mode (one power state) which requires the first power consumption, the power consumption restriction control unit 22 may permit or prohibit performing of a data write operation and a data read operation on the NAND flash memory 5 depending on whether the pin (PL) is set to the first potential (GND) or the open state.

In this case, if the pin (PL) is set to the first potential (GND), the controller 4 performs a data write operation and a data read operation on the NAND flash memory 5 based on a write request (write command) and a read request (read command) from the host 2. On the other hand, if the pin (PL) is set to the open state, the controller 4 does not perform a data write operation and a data read operation on the NAND flash memory 5 based on a write request (write command) and a read request (read command) from the host 2, but returns an error to the host 2 as a response to each of the write request and the read request.

The inquiry command processing unit 23 notifies the host 2 of information capable of identifying the power supplying capability, etc., of the connector 105 to which the SSD 3 is attached in response to the inquiry command from the host 2. In this case, the inquiry command processing unit 23 may notify the host 2 of the state of the pin (PL) of the connector 105 to which the SSD 3 is attached, the maximum power or maximum current of the connector 105 to which the SSD 3 is attached, the most power consuming operation mode (power state) among operation modes (power states) which are available with the connector 105 to which the SSD 3 is attached, etc.

Here, the case of notifying the maximum power or maximum current of the connector 105 will be explained.

If the pin (PL) of the connector 105 is set to the first potential (for example, the GND), the inquiry command processing unit 23 notifies the host 2 of information which indicates that the maximum power or maximum current which can be supplied from the connector 5 to which the SSD 3 is attached is the first power (14.85 W) or the first current (4.5 A) corresponding to the first power in response to the inquiry command from the host 2.

If the pin (PL) of the connector 105 is set to the open state, the inquiry command processing unit 23 notifies the host 2 of information which indicates that the maximum power or maximum current which can be supplied from the connector 5 to which the SSD 3 is attached is the second power (8.25 W) or the second current (2.5 A) corresponding to the second power in response to the inquiry command from the host 2.

In the case of notifying the most power consuming power state among power states which are available with the connector 105, the inquiry command processing unit 23 executes the following processes.

If the pin (PL) of the connector 105 is set to the first potential (for example, the GND), the inquiry command processing unit 23 notifies the host 2 of information which indicates the most power consuming power state among power states in which the SSD 3 can operate on the first power in response to the inquiry command from the host 2.

If the pin (PL) of the connector 105 is set to the open state, the inquiry command processing unit 23 notifies the host 2 of information which indicates the most power consuming power state among power state in which the SSD 3 can operate on the second power.

FIG. 7 shows an example of the operation modes (power states) supported by the SSD 3.

FIG. 7 shows a case where the SSD 3 supports four power states which require different amounts of power consumption. These power states are identified by different numbers (power state numbers) assigned to these power states. The maximum power consumption corresponding to the each power state indicates a maximum power that may be consumed in this state. Here, it is assumed that the maximum power consumption of the power state is higher as the number assigned to the power state is lower, and the maximum power consumption of the power state is lower as the number assigned to the power state is larger. Further, as the power consumption of the power state increases, the performance of the SSD 3 increases. For example, the speed of a read operation and a write operation on the NAND flash memory 5 increases as the power consumption of the power state increases, or the number of commands processed per unit time increases as the power consumption of the power state increases.

The maximum power consumption of the power state 0 is 14 W, for example. The maximum power consumption of the power state 1 is 11 W, for example. The maximum power consumption of the power state 2 is 8 W, for example. The maximum power consumption of a power state 3 is 5 W, for example.

In this SSD 3, all power states can be used if the pin 30 is connected to the GND. However, only either the power state 2 or the power state 3 can be used if the pin 30 is set to the open state. Therefore, if the pin 30 is set to the open state, the controller 4 automatically sets a power state to be used to the power state 2. Accordingly, the SSD 3 can operate within a range of power which can be stably supplied from the connector 105.

FIG. 8 shows a procedure of a power consumption restriction process executed by the SSD 3 in a case where the SSD 3 has a plurality of power states.

When the SSD 3 is powered on, the controller 4 of the SSD 3 starts operation in the power state 2, for example, and executes an initial setting process (step S11). In the initial setting process, the controller 4 firstly initializes the NAND flash memory 5, loads firmware necessary for operating the GND/Open determination unit 21 from the NAND flash memory 5, and enables the GND/Open determination function.

Subsequently, the controller 4 determines whether the pin 30 is connected to the GND or the pin 30 is set to the open state by the GND/Open determination function (step S12).

If the pin 30 is connected to the GND, the controller 4 switches the power state to be used to the power state 0 (step S13).

If the pin 30 is set to the open state, the controller 4 maintains the power state to be used in the power state 2 (step S14).

Subsequently, the controller 4 executes control of the NAND flash memory 5 using the set power state, and loads, for example, a logical-to-physical address translation table, various setting information, etc., from the NAND flash memory 5 into the DRAM 6.

Accordingly, in the present embodiment, even if the SSD 3 is connected to a connector having an insufficient power supply capability, the system will not be broken or the stability of the system will not be lost, and although performance is degraded, the system can still operate stably.

The sequence diagram of FIG. 9 shows a procedure of processing executed by the SSD 3 in response to an inquiry command from the host 2.

The host 2 transmits the inquiry command, which is a command to obtain the state of the SSD 3 or various setting information of the SSD 3, to the SSD 3 when needed.

When the controller 4 receives the inquiry command from the host 2, the controller 4 reports the state of the connector 105 to which the SSD 3 is attached (such as information which is capable of identifying the power supplying capability of the connector 105), to the host 2 as a return value in response to the inquiry command (step S21). In step S21, the controller 4 may report information indicating the maximum power or maximum current of the connector 105 to which the SSD 3 is attached, to the host 2 as the information which is capable of identifying the power supplying capability of the connector 105. Alternatively, the controller 4 may report information indicating the GND/Open of the pin 30 to the host 2 as the information which is capable of identifying the power supplying capability of the connector 105. Alternatively, the controller 4 may report the most power consuming power state among power states which are available with the connector 105 to which the SSD 3 is attached, to the host 2 as the information which is capable of identifying the power supplying capability of the connector 105.

For example, if the performance (read/write performance) of an SSD 3 is lower than expected, the host 2 can learn, by issuing the inquiry command, whether or not the degradation of performance is caused by the shortage of power supply from a connector to which the SSD 3 is attached.

Next, an example of the operation of reporting the state of the connector 105 to the host 2 will be described with reference to FIGS. 10 to 16. In FIGS. 10 to 16, a symbol O indicates optional implementation requirements (OPTIONAL), and a symbol M indicates mandatory implementation requirements (MANDATORY).

The SSD 3 includes a data structure for reporting the state of the SSD 3 and the various setting information of the SSD 3 to the host 2. The data structure may include information shown in FIG. 10.

The information shown in FIG. 10 indicates the maximum supplied current of the connector 105 to which the SSD 3 is attached. As shown in FIG. 10, a specific field of 1 byte (for example, byte 800) is used for reporting the maximum supply current of the connector 105 to which the SSD 3 is attached.

As shown in FIG. 10, upper 6 bits [7:2] of this field are reserved. Values expressed by low 2 bits [1:0] of this field indicate the following.

00b: 00b indicates that the maximum current (the maximum supply current) is not reported.

01b: 01b indicates that the maximum current which can be supplied from the connector 105 (the maximum supply current) is 2.5 A.

10b: 10b indicates that the maximum current which can be supplied from the connector 105 (the maximum supply current) is 4.5 A.

11b: 11b is an undefined reserved value.

The information explained with reference to FIG. 10 can also be expressed in such a manner as shown in FIG. 11. In FIG. 11, the bit indicating the state and the support bit are separated from each other.

In FIG. 11, bit 1 and bit 0 in the above-described specific field of 1 byte (for example, byte 800) indicate the following.

Bit 1: If bit 1 is set to 1, the maximum current which can be supplied from the connector 105 is 4.5 A. If the bit 1 is cleared to 0, the maximum current which can be supplied from the connector 105 is 2.5 A.

Bit 0: If bit 0 is set to 1, this field is supported. If bit 1 is cleared to 0, the field is not supported.

The above-described data structure for reporting the state and various setting information of the SSD 3 from the SSD 3 to the host 2 may include information shown in FIG. 12.

The information shown in FIG. 12 indicates the maximum power which can be supplied from the connector 105 to which the SSD 3 is attached (the maximum supply current). Here, it is assumed that the maximum power in a case where the power supply voltage has a nominal value, that is, the power supply voltage is 3.3 V (the nominal power) is reported.

A specific field of 1 byte (for example, byte 810) is used for reporting the maximum supply power (maximum nominal power) of the connector 105 to which the SSD 3 is attached.

As shown in FIG. 12, upper 6 bits [7:2] of this field are reserved. Values expressed by low 2 bits [1:0] of this field indicate the following.

00b: 00b indicates that the maximum power is not reported.

01b: 01b indicates that the maximum power which can be supplied from the connector 105 is 8.25 W.

10b: 10b indicates that the maximum power which can be supplied from the connector 105 is 14.85 W.

11b: 11b is a reserved value.

As shown in FIG. 13, a value which directly expresses a maximum power value itself may be reported from the SSD 3 to the host 2.

In FIG. 13, it is assumed that the maximum power value is expressed as a hexadecimal digit by a field having the size of 2 bytes (bytes 821 and 820). The scale of this field is 0.01 watts, for example. A value of 0 h of this field indicates that the maximum power is not reported.

The above-described data structure for reporting the state and various setting information of the SSD 3 from the SSD 3 to the host 2 may include information shown in FIG. 14.

The information shown in FIG. 14 indicates the lowest power state number is available with a connector to which the SSD 3 is attached. This lowest power state number indicates the power state number of the most power consuming power state (the power state number of highest-performance power state) among power states which are available with a connector to which the SSD 3 is attached, or indicates that no available power state is presence if an available power state does not exist.

A specific field of 1 byte (for example, byte 830) is used for reporting the lowest power state number which is available with a connector to which the SSD 3 is attached.

As shown in FIG. 14, most significant bit [7] of this field is reserved.

A value expressed by middle 5 bits [6:2] of this field indicates the lowest power state number which is available with a connector to which the SSD 3 is attached.

A value expressed by middle 1 bit [1] of this field indicates the presence or absence of a power state which is available with a connector to which the SSD 3 is attached.

If the least significant bit [0] of this field is set to 1, this field is supported. If the bit [0] of this field is set to 0, this field is not supported. The lowest power state number of the power states of the SSD 3 is 0, but since middle 5 bits [6:2] indicate the available lowest power state number and the least significant bit [0] indicates the presence or absence of support of this field, it is possible to differentiate between a case where the available lowest power state number cannot be reported and a case where the available lowest power state number is 0.

The above-described data structure for reporting the state and various setting information of the SSD 3 from the SSD 3 to the host 2 may include information shown in FIG. 15.

The information shown in FIG. 15 indicates the state of the pin 30 of the connector 105 to which the SSD 3 is attached.

In FIG. 15, the specific field of 1 byte (for example, byte 840) is used for reporting the state of the pin 30 of the connector 105 to which the SSD 3 is attached.

As shown in FIG. 15, upper 6 bits [7:2] of this field are reserved. In this field, bit 1 and bit 0 indicate the following.

Bit 1: If bit 1 is set to 1, the pin 30 is set to the open state. If bit 1 is cleared to 0, the pin 30 is connected to the GND.

Bit 0: If bit 0 is set to 1, this field is supported. If bit 1 is cleared to 0, the field is not supported.

The above-described data structure for reporting the state and various setting information of the SSD 3 from the SSD 3 to the host 2 may include information shown in FIG. 16.

The information shown in FIG. 16 indicates the type of connector 105 to which the SSD 3 is attached.

In FIG. 16, the specific field of 1 byte (for example, byte 850) is used for reporting the type of connector 105 to which the SSD 3 is attached.

As shown in FIG. 16, upper 6 bits [7:2] of this field are reserved. In this field, bit 1 and bit 0 indicate the following.

Bit 1: If bit 1 is set to 1, the SSD 3 is connected to a high-power M.2 connector. If bit 1 is cleared to 0, the SSD 3 is connected to a normal-power M.2 connector.

Bit 0: If bit 0 is set to 1, this field is supported. If bit 1 is cleared to 0, the field is not supported.

In the above description, the SSD 3 has a plurality of power states, and the power state to be used is switched in accordance with the power supply capability of the connector 105 to which the SSD 3 is attached, but these power states are also used for controlling the temperature of the SSD 3 such that the temperature of the SSD 3 will not exceed an allowable maximum temperature. That is, when a temperature detected by a temperature sensor in the SSD 3 reaches a threshold value, the controller 4 of the SSD 3 switches the power state to be used to a less power consuming power state. For example, if the temperature of the SSD 3 increases to a threshold value or more, even when the pin 30 is connected to the GND, the controller 4 prevents a further temperature increase by using the power state 3.

The SSD 3 may be configured to support only one power state.

FIG. 17 shows an example of the single power state supported by the SSD 3.

The SSD 3 only supports the power state 0. Therefore, the SSD 3 always uses the power state 0 and performs a data write operation and a data read operation on the NAND flash memory 5 using the power state 0. The maximum power consumption of the power state 0 is 14 W, for example.

If the SSD 3 only supports one power state, when the pin 30 is connected to the GND, the controller 4 of the SSD 3 performs a data write operation and a data read operation on the NAND flash memory 5 as usual in response to a write command and a read command from the host 2.

On the other hand, if the pin 30 is set to the open state, the controller 4 does not perform a data write operation and a data read operation on the NAND flash memory 5 but only performs an operation which can be performed on a current of 2.5 A or less. That is, if the controller 4 of the SSD 3 receives a write command or a read command from the host 2, the controller 4 of the SSD 3 returns an error to the host 2 as a response to the write command or the read command without performing a data write operation or a data read operation.

The operation which can be performed on a current of 2.5 A or less includes processing of the above-described inquiry command. The SSD 3 can notify the host 2 that the pin 30 is set to the open state and cannot perform an operation due to the shortage of power supply, etc., in response to the inquiry command from the host 2

The flowchart of FIG. 18 shows a procedure of a power consumption restriction process executed by the SSD 3 which only has the single power state 0.

The power consumption restriction process is executed if the pin 30 is set to the open state.

If a command received from the host is a read request (read command) or a write request (write command) (YES in step S31), the controller 4 of the SSD 3 returns an error to the host 2 as a response to the received command without executing command processing (that is, a data read operation or a data write operation on the NAND flash memory 5) (step S32).

If a command received from the host is the above-described inquiry command (YES in step S33), the controller 4 executes command processing and returns the state, etc., of the connector 105 to which the SSD 3 is attached, to the host 2 as a response to the received inquiry command (step S33).

Accordingly, even if the SSD 3 cannot perform a data read operation and a data write operation on the NAND flash memory 5 due to the shortage of power supply, the host 2 can easily understand the reason why the SSD 3 does not operate by issuing the inquiry command.

In case the power supply capability of the power supply circuit 104 is improved as the host 2 is remodeled, etc., afterward or the power supply circuit 104 of the host 2 has the capability of supplying sufficiently high power to all connectors in advance, a command (power control system Off command) which enables the host 2 to instruct a power control system of the SSD 3 configured to execute the power consumption restriction process not to operate may be prepared.

The sequence diagram of FIG. 19 shows a procedure of processing executed by the SSD 3 in response to the power control system Off command.

The host 2 transmits the power control system Off command to the SSD 3 when needed. If the controller 4 of the SSD 3 receives the power control system Off command from the host 2, the controller 4 of the SSD 3 disables the power control system (the above-described power consumption restriction function) (step S41).

The flowchart of FIG. 20 shows a procedure of a power control process executed by the SSD 3.

The controller 4 of the SSD 3 determines whether the power control system is enabled or not (step S51). If the power control system is enabled (YES in step S51), the controller 4 determines whether the pin 30 of the connector 105 to which the SSD 3 is attached is set to the GND or the open state (step S52), and based on the result of this determination, the controller 4 operates in an operation mode (the power state 0) with the most power consumption (step S53), or executes a process of restricting the power consumption of the SSD 3 (step S54).

On the other hand, if the power control system is disabled (NO in step S51), the controller 4 operates in the operation mode (the power state 0) with the most power consumption regardless of the state of the pin 30 of the connector 105 to which the SSD 3 is attached (step S53).

The power consumption restriction process of controlling the temperature of the SSD 3 such that the temperature of the SSD 3 will not exceed the allowable maximum temperature may be appropriately executed regardless of whether the power control system is enabled or disabled.

As described above, according to the present embodiment, as a specific pin (PL) of the connector 105 to which the SSD 3 is connected is set to the first electric potential or the open state, power which can be supplied via the connector 105 can be notified from the host (information processing apparatus) 2 to the SSD 3. As the SSD 3 operates within the range of the power (or current) which can be supplied via the connector 105, or does not operate if the SSD 3 cannot operate due to the shortage of power from the connector 105, the SSD 3 realizes a stable operation without causing a system trouble, a malfunction of the host 2 or the SSD 3, etc. Consequently, the reliability and stability of the whole system can be improved.

As an entirely different notification method, a method of transmitting one type of data transmitted via the differential signal line from the host to the SSD as the information indicating the power supplying capability of the connector is considered. However, since this method largely depends on an interface which interconnects the host and the SSD, implementation of this method may be difficult in some cases. In the present embodiment, information indicating the power supplying capability of the connector can be notified from the host to the SSD by a simple method.

Further, in the present embodiment, as the host 2 transmits the inquiry command to the SSD 3, the host 2 can learn the maximum supply power (or current) of the connector 105 to which the SSD 3 is connected, or the host 2 can recognize that the SSD 3 operates in the mode of reducing power consumption due to the shortage of the maximum supply power and therefore the performance (read/write performance) of the SSD 3 deteriorates, or the host 2 can recognize that the SSD 3 cannot read/write data due to the shortage of the maximum supply power. Therefore, the whole system will not be unstable, and the host 2 can quickly understand the reason why degradation of the performance (read/write performance) of the SSD 3 occurs or the reason why the SSD 3 cannot read/write data.

A case where the connector 105 has a plurality of power pins is mainly described in the present embodiment. However, in principle, even if the number of power pin is one, the power supply circuit 104 can realize a high-power connector/normal-power connector based on a difference of the maximum power (or maximum current) which can be supplied via one power pin. In this case, the maximum current which can be supplied via one power pin of the high-power connector is higher than the maximum current which can be supplied via one power pin of the normal-power connector. Therefore, the maximum power which can be supplied via one power pin of the high-power connector is also higher than the maximum power which can be supplied via one power pin of the normal power connector.

Accordingly, the present embodiment is applicable to a type of connector having one or more power pins. In this case, a state where the pin (PL) is set to the first electric potential (GND) indicates that the maximum power supplied from the power supply circuit 104 to the SSD 3 via one or more power pins of the connector 105 is the first power, and a state where the pin (PL) is set to the open state indicates that the maximum power supplied from the power supply circuit 104 to the SSD 3 via one or more power pins of the connector 105 is the second power.

In the present embodiment, a NAND flash memory is illustrated as a nonvolatile memory. However, the functions of the embodiment are also applicable to various other nonvolatile memories such as a change random access memory (PRAM), a resistive random access memory (ReRAM) and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing apparatus comprising:
a connector to which a storage device is connectable, the connector comprising a plurality of pins including one or more power pins and a plurality of signal pins, and
a power supply circuit configured to supply power to the storage device via the one or more power pins, wherein
the plurality of pins include a first pin which is set to a first electric potential or an open state based on a power supply capability of the power supply circuit,
the first pin being set to the first electric potential indicates that a maximum power that can be supplied from the power supply circuit to the storage device via the one or more power pins of the connector is a first power, and
the first pin being set to the open state indicates that the maximum power that can be supplied from the power supply circuit to the storage device via the one or more power pins of the connector is a second power, which is different from the first power.

2. The information processing apparatus of claim 1, wherein the first power is greater than the second power.

3. The information processing apparatus of claim 1, wherein
a maximum current corresponding to the first power is a first maximum current obtained by multiplying a first current which can be supplied per power pin by a total number of the power pins, and
a maximum current corresponding to the second power is less than the first maximum current.

4. The information processing apparatus of claim 1, wherein
the plurality of pins include a group of pins defined as not connected pins, and
the first pin is a pin in the group of pins defined as the not connected pins.

5. A storage device connectable to a connector of a host, the connector comprising a plurality of pins including one or more power pins and a plurality of signal pins, the storage device comprising:
a nonvolatile semiconductor memory; and
a controller configured to control the nonvolatile semiconductor memory, wherein
the controller is further configured to restrict a maximum power consumed by the storage device to a first power or less when a first pin of the plurality of pins is set to a first electric potential, and restrict the maximum power consumed by the storage device to a second power, which is different from the first power, when the first pin is set to an open state.

6. The storage device of claim 5, wherein the first power is greater than the second power.

7. The storage device of claim 5, wherein
a maximum current corresponding to the first power is a first maximum current obtained by multiplying a first current which can be supplied per power pin by a total number of the power pins, and
a maximum current corresponding to the second power is less than the first maximum current.

8. The storage device of claim 5, wherein
the plurality of pins include a group of pins defined as not connected pins, and
the first pin is a pin in the group of pins defined as the not connected pins.

9. The storage device of claim 5, wherein
the controller is further configured to perform a data write operation and a data read operation on the nonvolatile semiconductor memory based on a write request and a read request received from the host when the first pin is set to the first electric potential, and
the controller is further configured to return an error to the host as a response to each of the write request and the read request without performing the data write operation and the data read operation on the nonvolatile semiconductor memory based on the write request and the read request from the host when the first pin is set to the open state.

10. The storage device of claim 5, wherein
the controller is further configured to perform a data write operation and a data read operation on the nonvolatile semiconductor memory using any one of a plurality of operation modes which consume different amounts of power, and
the controller is further configured to perform a data write operation and a data read operation on the nonvolatile semiconductor memory using a first operation mode of the operation modes when the first pin is set to the first electric potential and perform a data write operation and a data read operation on the nonvolatile semiconductor memory using a second operation mode of the operation modes when the first pin is set to the open state.

11. The storage device of claim 10, wherein
the controller is further configured to notify the host of information which indicates a most power consuming operation mode among operation modes in which the storage device can operate on the first power or less, in response to an inquiry command from the host when the first pin is set to the first electric potential, and
the controller is further configured to notify the host of information which indicates a most power consuming operation mode among operation modes in which the storage device can operate on the second power or less, in response to the inquiry command from the host when the first pin is set to the open state.

12. The storage device of claim 5, wherein the controller is further configured to notify the host of information to identify a power supplying capability of the connector in response to an inquiry command from the host.

13. The storage device of claim 5, wherein the controller is further configured to notify the host of information which indicates whether the first pin is set to the first electric potential or the open state, in response to an inquiry command from the host.

14. The storage device of claim 5, wherein
the controller is further configured to notify the host of information which indicates that a maximum power or a maximum current which can be supplied from the connector is the first power or a first current corresponding to the first power in response to an inquiry command from the host when the first pin is set to the first electric potential, and
the controller is further configured to notify the host of information which indicates that the maximum power or the maximum current which can be supplied from the connector is the second power or a second current corresponding to the second power in response to the inquiry command from the host when the first pin is set to the open state.

15. The storage device of claim 5, wherein the controller is further configured to restrict the maximum power to the first power or the second power indicated by the first pin, when power is being supplied to the one or more power pins.

16. A storage device connectable to a connector of a host, the connector comprising a plurality of pins including one or more power pins and a plurality of signal pines, the storage device comprising:
a nonvolatile semiconductor memory; and
a controller configured to control the nonvolatile semiconductor memory, wherein
the controller is configured to perform a data write operation and a data read operation on the nonvolatile semiconductor using any one of a plurality of operations modes, which consume different amounts of power, and
the controller is further configured to perform a data write operation and a data read operation on the nonvolatile semiconductor using a first operation mode in which a maximum power consumption is a first power or less among the operation modes, when a first pin of the pins is set to a first electric potential, and perform a data write operation and a data read operation on the nonvolatile semiconductor using a second operation mode in which a maximum power consumption is a second power or less among the operation modes, when the first pin is set to an open state.

* * * * *